(12) United States Patent
Dourbal

(10) Patent No.: US 10,235,343 B2
(45) Date of Patent: Mar. 19, 2019

(54) METHOD FOR CONSTRUCTING A CIRCUIT FOR FAST MATRIX-VECTOR MULTIPLICATION

(71) Applicant: Pavel Dourbal, Princeton Junction, NJ (US)

(72) Inventor: Pavel Dourbal, Princeton Junction, NJ (US)

( * ) Notice: Subject to any disclaimer, the term of this patent is extended or adjusted under 35 U.S.C. 154(b) by 0 days.

(21) Appl. No.: 15/805,770

(22) Filed: Nov. 7, 2017

(65) Prior Publication Data

US 2018/0157622 A1 Jun. 7, 2018

Related U.S. Application Data

(63) Continuation-in-part of application No. 14/748,541, filed on Jun. 24, 2015, which is a continuation of application No. 13/726,367, filed on Dec. 24, 2012.

(60) Provisional application No. 62/502,775, filed on May 8, 2017, provisional application No. 61/723,103, filed on Nov. 6, 2012.

(51) Int. Cl.
*G06F 17/16* (2006.01)
*G06J 1/00* (2006.01)

(52) U.S. Cl.
CPC ............... *G06F 17/16* (2013.01); *G06J 1/00* (2013.01)

(58) Field of Classification Search
None
See application file for complete search history.

(56) References Cited

U.S. PATENT DOCUMENTS

| 6,003,056 A | * | 12/1999 | Auslander | G06F 17/142 |
| | | | | 708/404 |
| 2006/0001673 A1 | * | 1/2006 | Brand | G06T 13/40 |
| | | | | 345/582 |
| 2014/0181171 A1 | * | 6/2014 | Dourbal | G06F 17/16 |
| | | | | 708/607 |
| 2016/0013773 A1 | * | 1/2016 | Dourbal | G06F 17/16 |
| | | | | 708/209 |
| 2018/0157622 A1 | * | 6/2018 | Dourbal | G06J 1/00 |

* cited by examiner

*Primary Examiner* — David H Malzahn
(74) *Attorney, Agent, or Firm* — Larisa Migachyov

(57) ABSTRACT

A circuit for fast matrix-vector multiplication and a method for constructing that circuit are provided, comprising processing a matrix to obtain a pair matrix, which is then used to construct a circuit.

3 Claims, 10 Drawing Sheets

METHOD FOR CONSTRUCTING A CIRCUIT FOR FAST MATRIX-VECTOR MULTIPLICATION

CROSS-REFERENCE TO RELATED APPLICATIONS

The present application is a continuation-in-part of U.S. application Ser. No. 14/748,541, filed Jun. 24, 2015, now abandoned which is a continuation of U.S. application Ser. No. 13/726,367, filed Dec. 24, 2012, now abandoned which claims priority from U.S. Provisional App. No. 61/723,103, filed Nov. 6, 2012. The present application also claims priority from U.S. Provisional App. No. 62/502,775, filed May 8, 2017. All of these applications are herein incorporated by reference.

BACKGROUND

Field of the Invention

The present invention relates generally to signal processing, and more specifically to circuits for performing fast matrix-vector multiplication for purposes of digital filtering or signal filtering with a digital component.

Background of the Invention

Digital data often arises from the sampling of an analog signal, for example by determining the amplitude of an analog signal at specific times. The process of converting the analog signal to digital data is called demodulation.

A digital filter operates by multiplying a vector by a matrix, wherein the vector is the set of values derived from sampling an analog signal, or a set of digital values from a digital signal. Since the matrix-vector multiplication has to be performed repeatedly each time a new value appears, and since the way that a digital filter works means that most of the values in the vector are repeated from clock cycle to clock cycle, it is important to reduce the number of operations and the number of modules required to perform the matrix-vector multiplication each time.

A need exists for a circuit that can perform matrix-vector multiplication in a quick and efficient way.

SUMMARY OF THE INVENTION

An object of the present invention is to create a circuit for performing matrix-vector multiplication quickly.

Another object of the present invention is to create a method for processing a matrix in order to create a circuit for performing matrix-vector multiplication quickly.

The mathematical steps that precede the construction of the circuit are solely intended to facilitate construction of the circuit. The end result of the method of the present invention is an electrical circuit.

The method of the present invention is a method for constructing a circuit for multiplying an input vector by a first matrix. First, a pipeline delay associated with an adder circuit is determined. The pipeline delay depends on the type of adder circuit used for the circuit of the present invention.

After the pipeline delay is determined, a maximum delay is determined; the maximum delay is the sum of the pipeline delay and the number of columns in the first matrix, minus 1.

After the maximum delay is determined, a kernel vector is constructed. The kernel vector comprises all the unique nonzero elements of the first matrix. Each element of the kernel vector comprises an index.

After the kernel vector is constructed, a commutator matrix is constructed. To construct the commutator matrix, each nonzero element in the first matrix is replaced by the index of that element in the kernel vector.

After the commutator matrix is constructed, it is processed and used to generate a pair matrix. To do so, the following steps are repeated until there is only one nonzero element left in each row of the processed commutator matrix:

a. First, the following steps are repeated until all the pairs in the processed commutator matrix are identified:
  i. A pair is identified, where a pair is a horizontal pattern comprising a first nonzero element and a second nonzero element in the same row as the first nonzero element.
  ii. The distance between the first nonzero element and the second nonzero element is determined, wherein the distance is 1 when the first nonzero element and the second nonzero element are located directly next to each other and increases by 1 for every element located between the first nonzero element and the second nonzero element.
  iii. All the pairs comprising the same first nonzero element, the same second nonzero element, and the same distance, are identified, and the number of occurrences of that particular pair is noted.
  iv. The most frequently occurring pair of the pairs remaining on the list is identified; if there is no most frequently occurring pair, the pairs are arranged in random order and a random pair is identified.
b. The identified pair is entered into a pair matrix as a new row, wherein the row comprises an index, the first nonzero element, the second nonzero element, the distance, and an additional delay element (initially set to zero). The lowest index is the number of elements in the kernel vector plus 1.
c. Then, for every occurrence of the pair in the commutator matrix, the first nonzero element is replaced by the index and the second nonzero element is replaced by a zero.
d. Steps a-c are repeated until there is only one nonzero element left in each row of the processed commutator matrix.

Next, an output terms vector is created, which comprises the one nonzero element of each row of the processed commutator matrix; if a row of the processed commutator matrix does not comprise a nonzero element, the corresponding element of the output terms vector is zero.

Next, an output delay vector is created, wherein each element is the difference between the maximum delay and the number of zeros to the right of each nonzero element in the processed commutator matrix; if a row of the processed commutator matrix does not comprise a nonzero element, the corresponding element of the output delay vector is a zero.

Next, the pair matrix is processed. For each row of the pair matrix, it is determined whether or not the first nonzero element is an element of the kernel vector. If it is not, the pipeline delay is subtracted from the distance. Next, it is determined whether or not the second nonzero element is an element of the kernel vector. If it is not, the pipeline delay is subtracted from the additional delay element. Once all the rows of the pair matrix are processed, the smallest negative number in the matrix is determined. The absolute value of that smallest negative number is then added to each distance element and each additional delay element in each row of the pair matrix to create a processed pair matrix.

The processed pair matrix, kernel vector, processed commutator matrix, output terms vector, and output delay vector are then used to assemble a circuit by the following steps.

An input signal is routed through at least one amplifier, wherein the number of amplifiers is the same as the number of elements in the kernel vector. Each amplifier magnifies the signal by the magnitude of the corresponding element in the kernel vector. At least one amplified output signal is obtained; the amplified output signals are numbered according to the index of the corresponding elements in the kernel vector.

Next, the following steps are performed for each row of the processed pair matrix. The output signal whose index is the same as the second element of the row is connected to a delay element wherein the delay of the delay element is the same in magnitude as the fourth element of the row to obtain a first delayed signal. The output signal whose index is the same as the third element of the row is connected to a delay element wherein the delay of the delay element is the same in magnitude as the fifth element of the row to obtain a second delayed signal. The first delayed signal and the second delayed signal are then routed through an adder circuit to obtain an output signal. The output signal is then labeled with the index of the corresponding row of the processed pair matrix. These steps are repeated for each row of the processed pair matrix.

Next, for each element of the output terms vector, an output with the index equal to the element of the output terms vector is connected to a delay element whose delay is equal to the corresponding element of the output delay vector; then the output of the delay element is connected to the output. If the element of the output terms vector is a zero, the corresponding output is connected to ground.

The delay elements may be fixed or adjustable. For a fixed delay element, each delay element is created by serially connecting a plurality of delay elements, each delay element possessing a delay of one unit, wherein the number of serially connected delay elements equals the corresponding element of the output delay vector. The output of the delay element is then connected to the last delay element in the plurality of serially connected delay elements.

For an adjustable delay element, each delay element is created by serially connecting a plurality of delay elements, each delay element possessing a delay of one unit, wherein the number of serially connected delay elements equals the maximum delay. The output of the delay element is then connected to a connection between a first and second delay element, wherein the first and second delay element are located in such a way as to result in a delay between the output and the output of the delay element that equals to the corresponding element of the output delay vector.

LIST OF FIGURES

DETAILED DESCRIPTION OF THE PREFERRED EMBODIMENT

Figure 1:
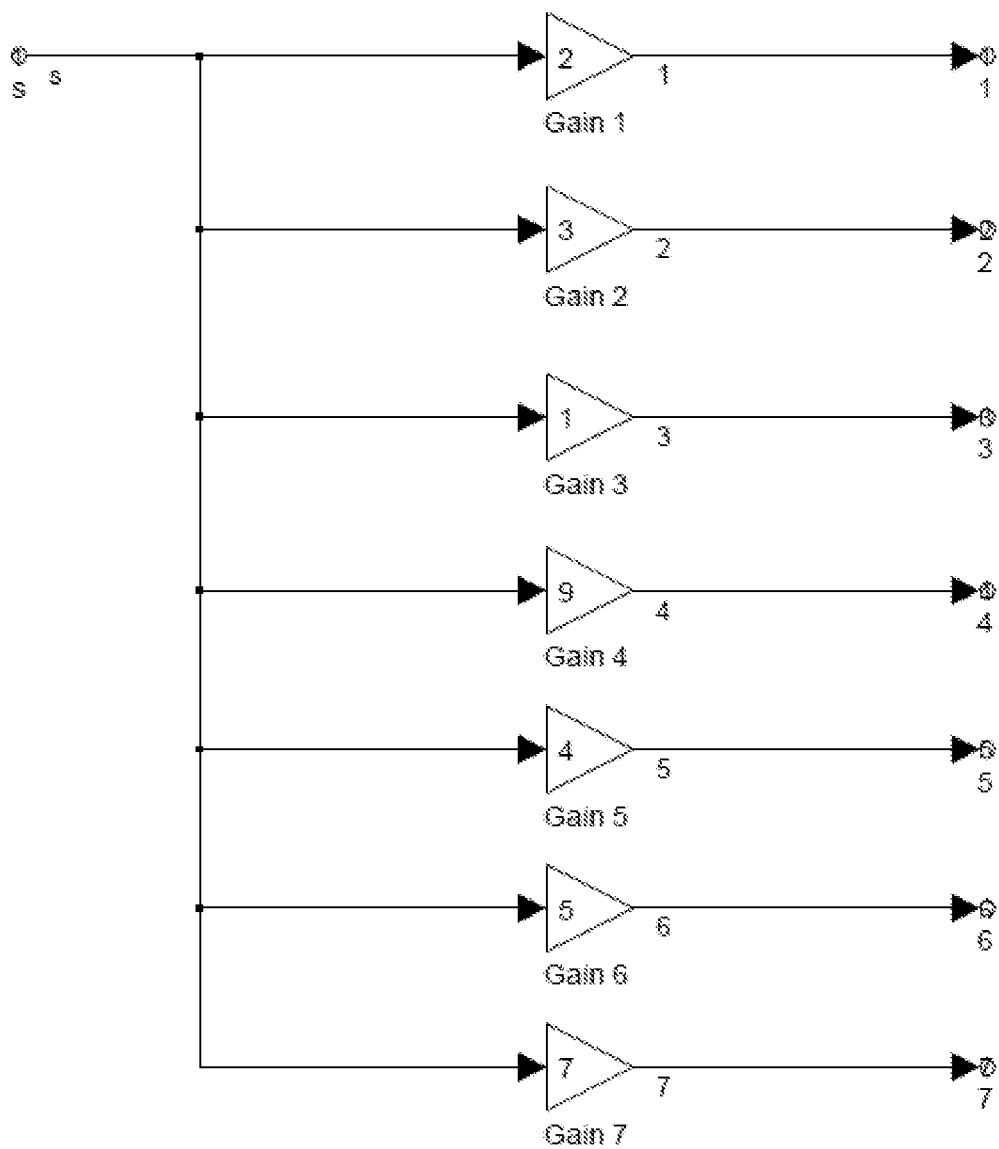
FIG. 1 shows the first step in the method of assembling a circuit of the present invention.

As can be seen from the below description, the present invention comprises a circuit for performing matrix-vector multiplication. The circuit comprises at least one amplifier component, at least one adder component, and at least one delay component. There are no other electronic components used in creating the circuit.

The amplifier element that is preferable for practicing the present invention is a digital or analog non-inverting or inverting fixed or variable gain linear electronic signal amplifier; other amplifier elements, such as an optical amplifier or digital multiplier may also be used. The adder element that is preferable for practicing the present invention is a two-input unity gain repeater; other adder elements, such as a non-inverting linear differential amplifier with its inverting input supplied through an inverting amplifier, or an inverting linear differential amplifier with its non-inverting input supplied through an inverting amplifier, or a two-input digital adder may also be used. The delay element that is preferable for practicing the present invention is an analog non-dispersive delay line, a digital memory-based FIFO device; other delay elements, such as optical delay lines, may also be used.

Before the configuration and number of the amplifier, adder, and delay components may be determined, the matrix (referred to as the original matrix in the below description) needs to be processed. The processing steps for one embodiment of the invention are outlined below. It will be understood that while these processing steps are pure mathematical operations, they are engaged in with the purpose of deriving the values for the delay elements, amplifier elements, and adders for the circuit of the present invention.

An example is used to explain the method of the present invention more clearly. It will be understood that the present example is non-limiting as far as the dimensions of the matrix or vector or any numerical values used therein are concerned. While the present example is a 4×4 matrix, any matrix dimensions may be used; the present example is used solely for illustration.

A computing device is used to perform the mathematical operations required by the present invention. The computing device may be a cloud computer, embedded computer, laptop, desktop, server, mobile device such as a smartphone or tablet, or a wearable computing device. The computing device must possess a processor and a memory capable of performing simple mathematical operations.

The first step for processing the original matrix is to separate it into a kernel and commutator. The kernel is a vector comprised of all the unique nonzero elements of the matrix. The commutator is a matrix in which each unique nonzero element is replaced by its index in the kernel vector. So, for example, the following original matrix:

```
2 0 0 3
3 1 2 9
0 4 5 0
0 0 7 0
``` may be decomposed into the kernel [2 3 1 9 4 5 7] and the commutator

```
1 0 0 2
2 3 1 4
0 5 6 0
0 0 7 0
```

After the commutator is created, it is used to generate a pair matrix. The pair matrix is created in the following way. The commutator matrix is analyzed to determine the most frequently occurring pair, wherein a pair is a horizontal pattern of two nonzero elements. For example, the first row of the commutator comprises the pair 1 2, with a distance of 3 between them. The second row of the commutator comprises several pairs, including the pair 2 3, with a distance of 1 between them, the pair 3 1, with a distance of 1 between them, the pair 1 4, with a distance of 1 between them, the pair 2 1, with a distance of 2 between them, the pair 3 4, with a distance of 2 between them, and the pair 2 4, with a distance of 3 between them. All those pairs are found and ranked by frequency of occurrence. In the present example, each pair has a frequency of 1. If some pairs are more frequent than others, the more frequently occurring pair is processed first.

For each pair, a row is added to the pair matrix as follows. The first number in the row is an index starting at the number of elements in the kernel vector plus 1; so, in the present example, the lowest index in the pair matrix is 8. The second and third numbers in the row are the two elements of the pair. The fourth number in the row is the distance between the elements. The fifth number in the row is an additional delay element that is initially set to zero for each row. So, in the present example, the first row of the pair matrix is going to be [8 1 2 3 0].

As each row in the pair matrix is created, the commutator is processed as follows: the first element of the pair is set to zero and the second element of the pair is replaced by the index of that pair in the pair matrix. So, after the first row of the pair matrix is created as follows, the commutator is processed to look like this:

```
0 0 0 8
2 3 1 4
0 5 6 0
0 0 7 0
```

Another pair may be added to the pair matrix as follows: [9 2 3 1 0]. After that pair is created, the commutator is processed to look like this:

```
0 0 0 8
0 9 1 4
0 5 6 0
0 0 7 0
```

The next pair may be added to the pair matrix as follows: [10 9 1 1 0]. After that pair is created, the commutator is processed to look like this:

```
0 0 0 8
0 0 10 4
0 5 6 0
0 0 7 0
```

The steps are repeated until each row of the commutator matrix comprises only one nonzero element. In the present example, the commutator matrix eventually looks like this:

```
0 0 0 8
0 0 0 11
0 5 6 0
0 0 7 0
``` and finally, like this:

```
0 0 0 8
0 0 0 11
0 0 12 0
0 0 7 0
```

It will be noted that while in the preferred embodiment of the invention, the most frequently occurring pairs are put in the pair matrix first, the pairs may be added to the pair matrix in any order.

After the processing, the pair matrix looks like this:

```
 8  1 2 3 0
 9  2 3 1 0
10  9 1 1 0
11 10 4 1 0
12  5 6 1 0
```

Each row of the pair matrix comprises an index, two inputs (i.e. for row 8, the inputs are 1 and 2), a delay associated with the first input, and a delay associated with the second input. Initially, the delay associated with the second input is set to zero. The delay associated with the first input is the horizontal distance between the two elements that comprise the pair.

After the pair matrix is produced, it is then edited to calculate the delay associated with the second input. This step is important due to the fact that an adder circuit introduces a delay of its own that would not exist in an abstract world, but exists in the real world. So, for example, if a signal goes through an amplifier and an adder circuit before ending up as an input to another adder circuit, it will be delayed compared to a signal that only goes through an amplifier before ending up as the input to another adder circuit. In order for the signals to line up properly, an additional delay element should be introduced to compensate.

Thus, the delay associated with the particular adder circuit used for practicing an embodiment of the present invention is determined. While the delay can be any value, for purposes of describing this particular embodiment of the present invention, let us assume that the delay of the particular adder circuit is 1.

The next step of the analysis of the pair matrix is to determine which input to a pair comes from another pair in the pair matrix. So, for example, row 8 uses inputs 1 and 2, which do not come from another pair in the pair matrix. Row 10, however, uses input 9 which comes from another pair in the pair matrix. Thus, the delays associated with row 10 must be adjusted to account for the delay inherent in the adder circuit. In order to do so, the delay associated with the adder circuit (in our case, 9) must be subtracted from the delay associated with the first input (since that one comes from another pair in the pair matrix) and the delay associated with the second input will not be changed (since that one does not come from another pair in the pair matrix).

More precisely, the process must be as follows. An array of time delay aligning values is created and each of its elements is set to zero. The length of the array is equal to the sum of the number of kernel elements and the number of rows in the pair matrix. For every row of the pair matrix, starting from the first row and progressing down to the last row, a corresponding element of the time delay aligning value array is set to be equal to a sum of the pipeline delay with a maximum of the first and the second argument delays (columns 4 and 5). From this value two argument time delay correction values are obtained by subtracting from it the corresponding time aligning delay values of the rows corresponding to the first and the second arguments (columns 2 and 3). The first of these values is added to the delay value of the first argument (column 4) and the second one is added to the delay value of the second argument (column 5). Then the minimal value of the argument delays (columns 4 and 5) is subtracted from the both of these delay values and from the current time alignment delay value. In the end, each element of the array of time delay aligning values is replaced with a difference of the maximum array value and its own value. The pair matrix then becomes:

```
 8  1 2 3 0
 9  2 3 1 0
10  9 1 0 0
11 10 4 0 0
12  5 6 1 0
```

The values of the elements of the time delay aligning array are
1 1 1 1 1 1 1 0 0 0 0 0

After the processed pair matrix is finalized as above, a circuit is put together based on the matrix. The method for assembling the circuit based on the pair matrix is detailed below. In brief summary, for each element of the kernel vector, the initial input is routed through an amplifier whose gain is the same as the element of the kernel vector. In the present example, the kernel vector is [2 3 1 9 4 5 7]. It contains 7 elements. Thus, the input is routed through 7 different amplifiers (labeled g1-g7), where the gain of the amplifier is the same as the corresponding element of the kernel vector. The output of each amplifier is labeled with the index number of the element in the kernel vector (i.e. 1-7). FIG. 1 shows this portion of the circuit.

As is clear from this description, the kernel vector may comprise any number of terms, which means that any number of amplifiers may be used for this part of the circuit. While 7 amplifiers are used in this present example, the number is not intended to be limiting.

Figure 2:
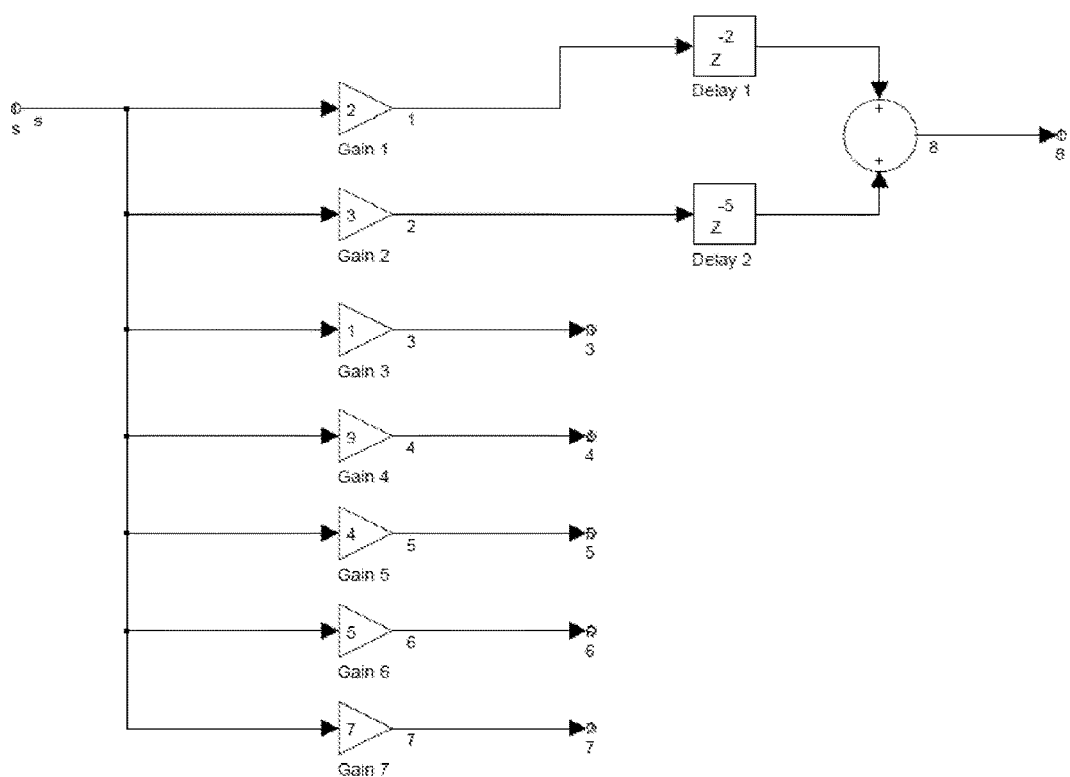
FIG. 2 shows an intermediate step in the method of assembling a circuit of the present invention.

After all the amplifiers are connected, the remaining circuit is put together based on the pair matrix. For each row of the processed pair matrix, the corresponding signals are put through delay elements and then added together by means of an adder circuit. For example, the first row of the processed pair matrix is [8 1 2 3 0]. That means that signals 1 and 2 (i.e. the outputs of the amplifiers numbered 1 and 2) are selected. Each signal is or is not put through a delay element; signal 1 is put through a delay element with a delay of 3 and signal 2 is not delayed. Then, the outputs of the two delay elements are put through an adder circuit. The output of the adder circuit is labeled with the index number 8, since that is the index of the corresponding row in the processed pair matrix. FIG. 2 shows this portion of the circuit.

Figure 3:
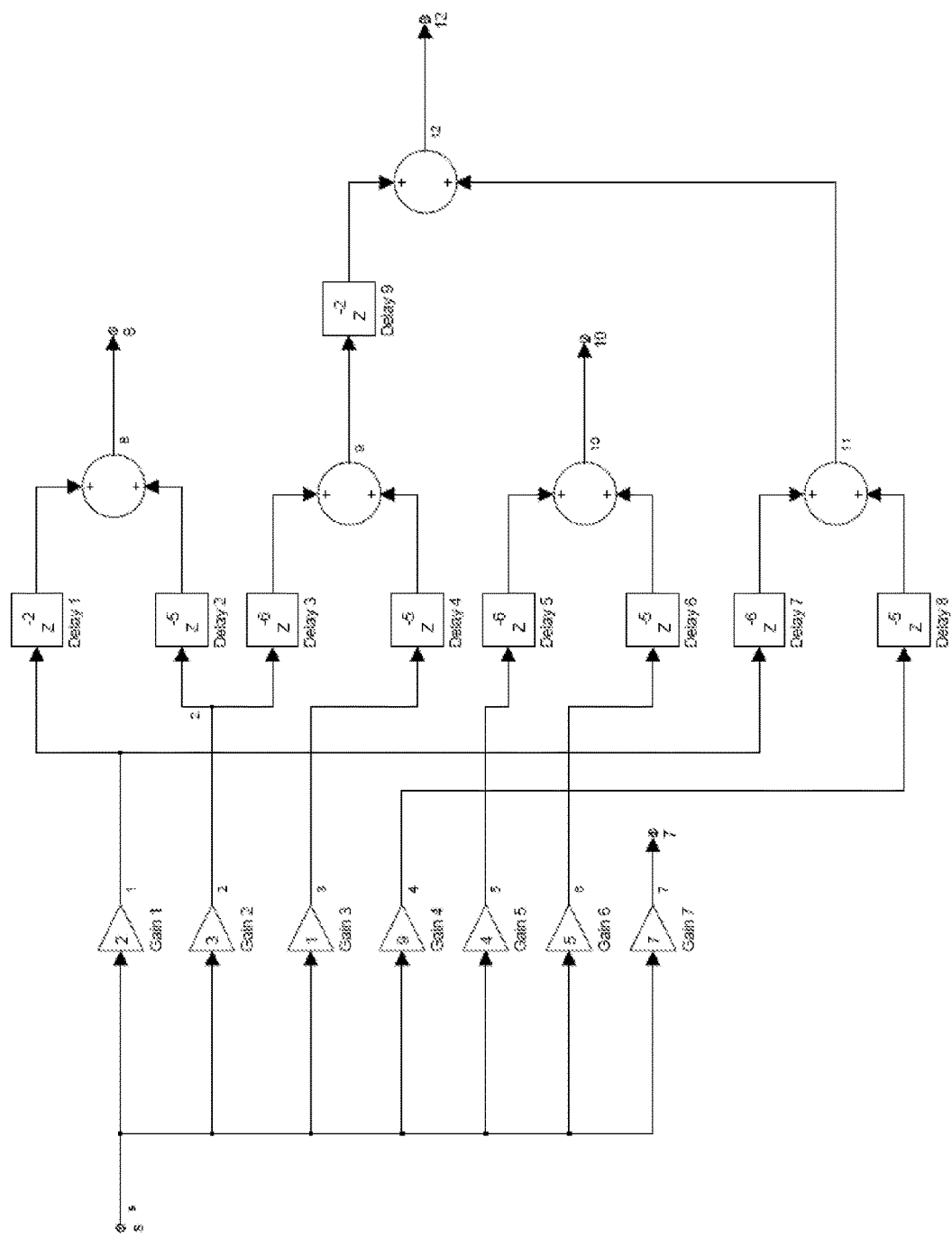
FIG. 3 shows an intermediate step in the method of assembling a circuit of the present invention.

The process is repeated for each row of the processed pair matrix. FIG. 3 shows the completed circuit. As is clear from the description, the processed pair matrix may comprise any number of rows, which means that any number of adder circuits may be used for this part of the circuit.

After the circuit is completed, the next step is determining which signals are the outputs of the circuits. For that, the processed commutator matrix is required. In the present example, the processed commutator matrix (as presented above) is:

```
0 0  0  8
0 0  0 11
0 0 12  0
0 0  7  0
```

Figure 4:
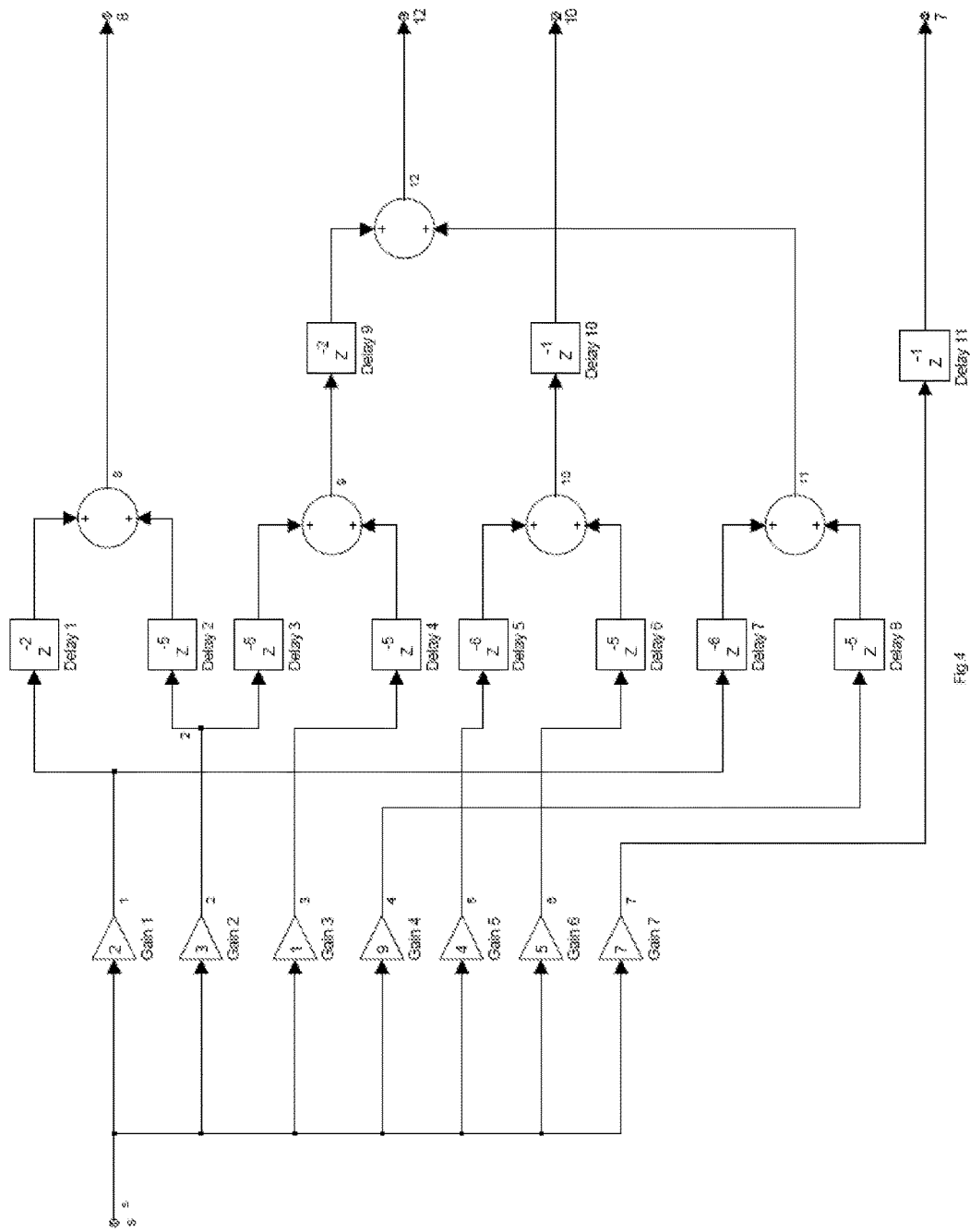
FIG. 4 shows a circuit of the present invention fully assembled.

The nonzero terms of the matrix are 8, 11, 12, and 7. The signals with those index numbers are the outputs of the circuit, as shown in FIG. 4. The signals are presented in the order of the rows of the processed commutator matrix, from top to bottom; i.e. [8 11 12 7]. The signals are delayed by the number of delays equal to the sum of the number of zeros to the right side of the nonzero term and the value of the corresponding element of the time delay alignment array; i.e. [8 (no delay) 11 (no delay) 12 (1 delay) 7 (2 delays)].

While the present commutator matrix does not comprise any rows that are all zeros, it may be possible that such a situation may arise. In that event, the corresponding output signal will be connected to ground.

Figure 5:
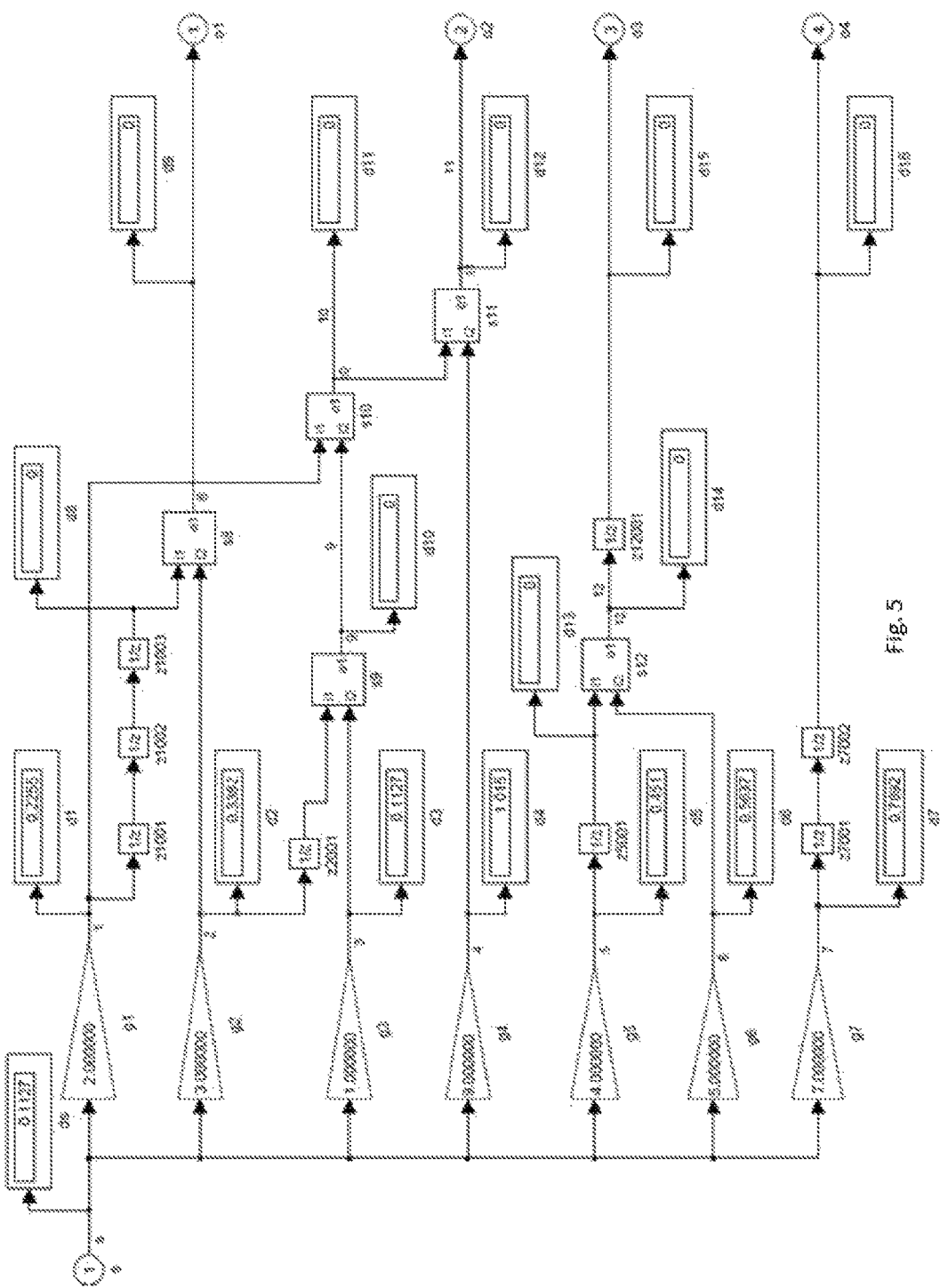
FIG. 5 shows a circuit of the present invention in operation.

The operation of the circuit of the present invention will now be discussed. An example circuit used for the below discussion is shown in FIG. 5. It will be understood that any circuit assembled according to the methods of the present invention may be substituted for the below example.

FIG. 5 shows the first of a series of clock cycles in the operation of a circuit assembled according to the method of the present invention. The same example matrix is used; it is restated below for convenience:

$$\begin{matrix} 2 & 0 & 0 & 3 \\ 3 & 1 & 2 & 9 \\ 0 & 4 & 5 & 0 \\ 0 & 0 & 7 & 0 \end{matrix}$$

It is to be assumed that the input values prior to the current input value have all been zero. The current input value ds is 0.1127, as shown in FIG. 5. Thus, the input vector at the present clock cycle is:

$$\begin{matrix} 0 \\ 0 \\ 0 \\ 0.1127 \end{matrix}$$

The input value of 0.1127 first goes through the amplifiers g1-g7. For each one of the amplifiers, the input value gets multiplied by the value of the amplifier, resulting in signals d1-d7. The magnitude of each amplifier is equal to an element of the kernel vector.

The signals d1-d7 then go through delays and summators as shown in the Figure. It will be noted that at this clock cycle, the output of each summator is 0, since the delay associated with each summator is 1 (as assumed for this example). Thus, the outputs o1-o4 show zero values at this point.

Figure 6:
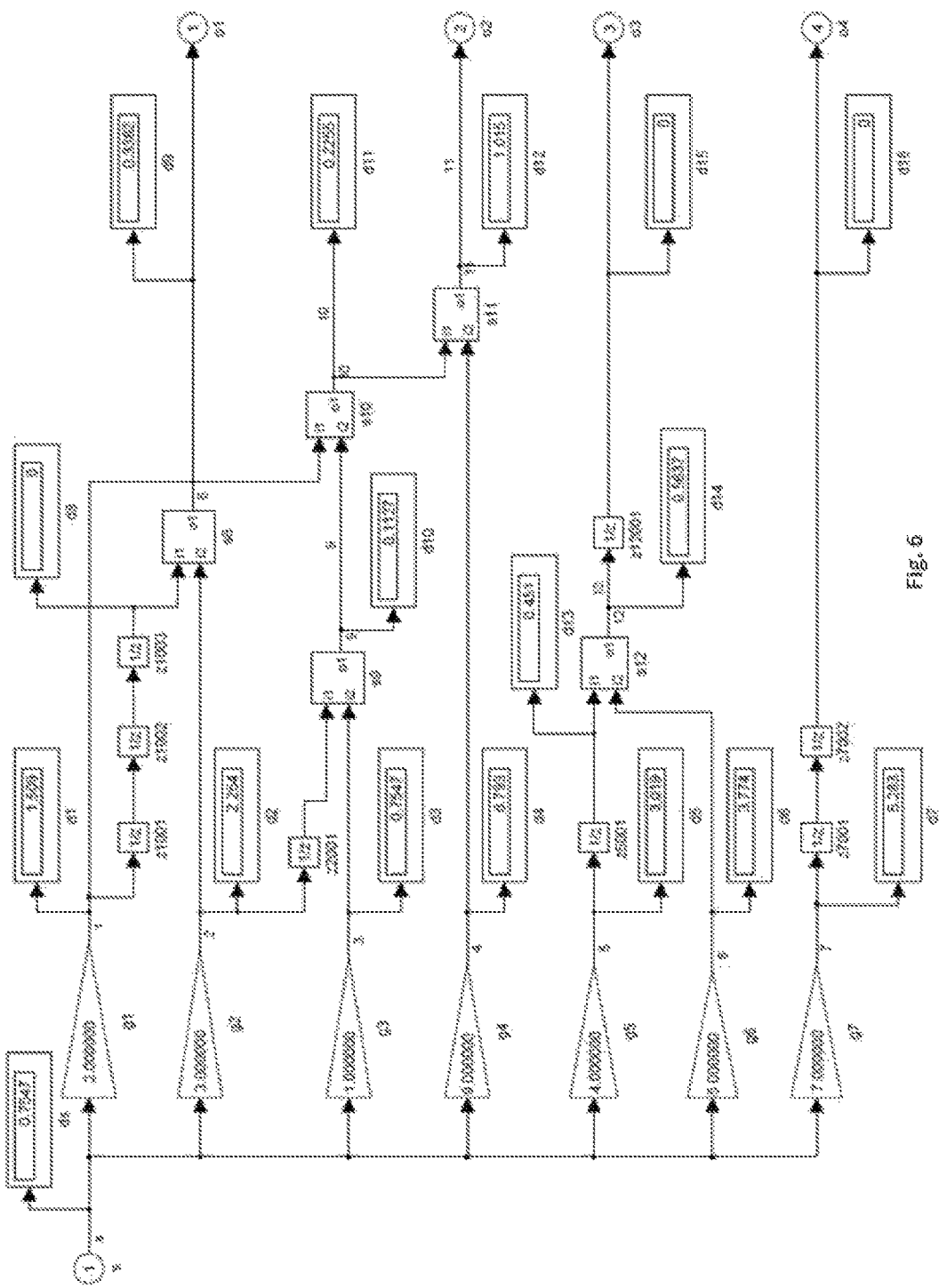
FIG. 6 shows a circuit of the present invention in operation.

FIG. 6 shows the next clock cycle after the clock cycle shown in FIG. 5. The outputs of the summators now show the sums of the values put into them at the last clock cycle. Looking at the summator s8, the values that entered it at the prior clock cycle were 0.3382 (i.e. 0.1127×3) and 0 (since input i1 of the summator s8 goes through three delay elements before entering the summator). When they are added, the answer is 0.3382; therefore, the output of the summator is 0.3382.

Similarly, looking at the summator s9, the values that entered it at the prior clock cycle were 0.1127 and 0; the sum of those values is 0.1127, as shown in value d10 at the output of summator s9. Looking at the summator s12, the values entering the summator at the prior clock cycle were 0.5637 and 0; the output of the summator is 0.5637. It will be noted that there is one more delay element on the output of the summator s12, so at this point, the value of the signal at the output o3 is still zero.

We will now turn to summator s10, which takes its inputs from the output of another summator and the output of amplifier g1. At the prior clock cycle (shown in FIG. 5), the value of the output of the amplifier g1 was 0.2255 and the value of the output of the summator s9 was 0. Thus, the output of summator s10 (shown in FIG. 6) is 0.2255 at this clock cycle.

Turning now to summator s11, we note that it takes its inputs from the output of summator s10 and the amplifier g4. At the prior clock cycle (shown in FIG. 5), the output of summator s10 was 0 and the output of amplifier g4 was 1.015. Thus, the output of summator s11 (as shown in FIG. 6) is 1.015 for this clock cycle.

We now look at the outputs o1-o4. The outputs o1-o4 show the values:

0.3382
1.015
0
0

This is the result of multiplying:

$$\begin{matrix} 2 & 0 & 0 & 3 \\ 3 & 1 & 2 & 9 \\ 0 & 4 & 5 & 0 \\ 0 & 0 & 7 & 0 \end{matrix} \times \begin{matrix} 0 \\ 0 \\ 0 \\ 0.1127 \end{matrix} = \begin{matrix} 0.3382 \\ 1.015 \\ 0 \\ 0 \end{matrix}$$

Turning now to the next clock cycle, shown in FIG. 6, a new value is inputted at this clock cycle. It will be noted that each subsequent new value is added to the bottom of the input vector, and the top element of the input vector from the prior clock cycle is deleted; i.e. the circuit of the present invention operates in a conveyor-belt fashion. The new value is 0.7547, making the new input vector $$\begin{matrix} 0 \\ 0 \\ 0.1127 \\ 0.7547 \end{matrix}$$

The outputs of the amplifiers now show the result of multiplying 0.7547 by the magnitude of each amplifier, as shown in FIG. 6. As noted above, the outputs of the summators still show the results from the last clock cycle of FIG. 5. To see the outputs of summators from the present clock cycle of FIG. 6, it is necessary to look at FIG. 7.

Figure 7:
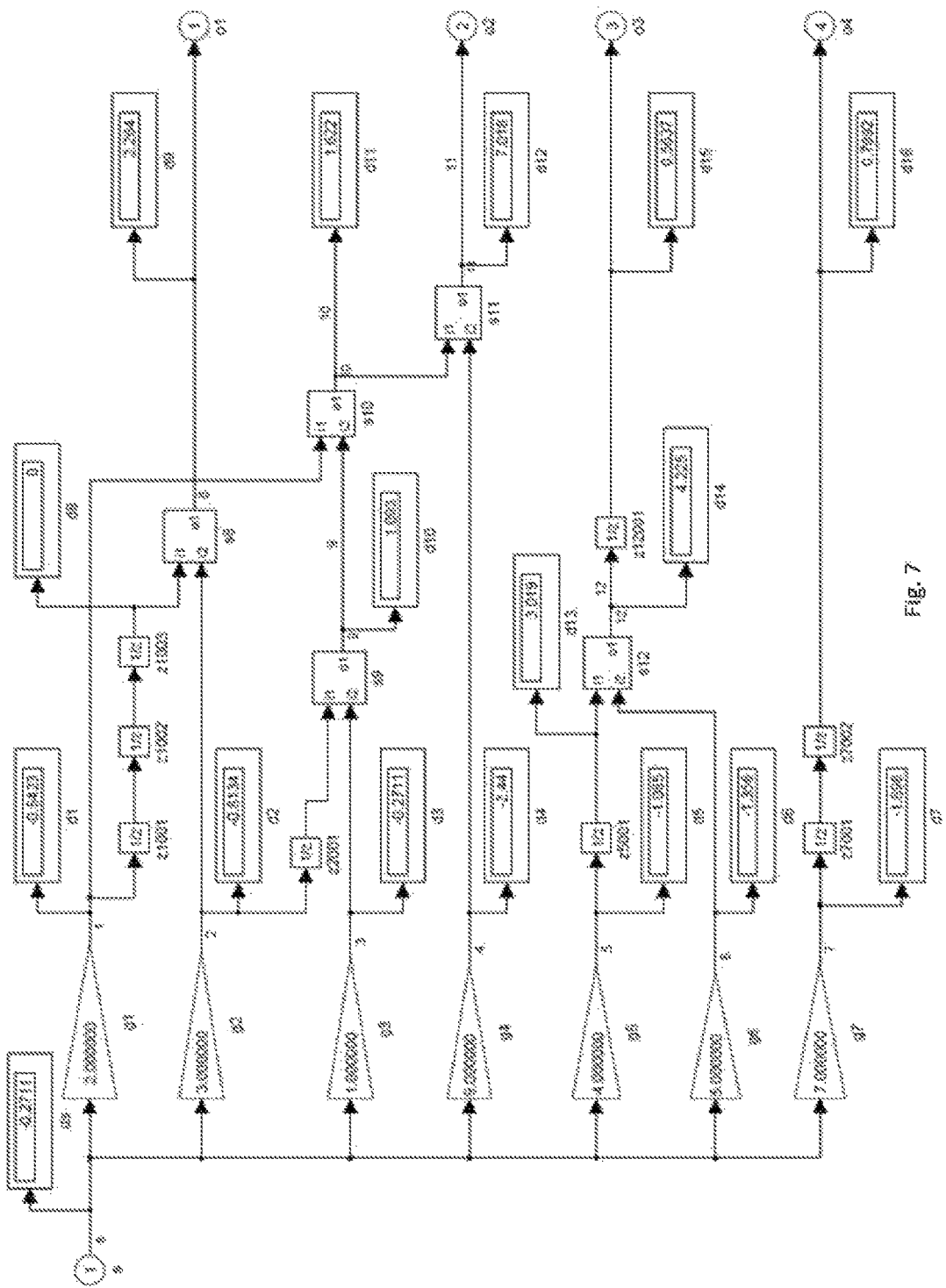
FIG. 7 shows a circuit of the present invention in operation.

Turning now to FIG. 7, the output of the summator s8 is 2.264. That is the sum of the two inputs to that summator (both shown in FIG. 6)—the output of the amplifier g2, which is 2.264, and the output of the amplifier g1, which is then passed through three delay elements; since the value of that amplifier 3 clock cycles ago was zero, that value is still 0. The output of the summator s8, therefore, is 2.264.

Similarly, the output of the summator s9, as shown in FIG. 7, is 1.093. Looking at FIG. 6 for the inputs to that summator, we see the output of the amplifier g3, which is 0.7547, and the output of the amplifier g2, which is passed through one delay element; thus, the value on the output of that delay element is the value of the output of amplifier g2 from one clock cycle ago, which is 0.3382. The output of the summator s9, therefore, is 0.7547+0.3382=1.093.

The output of the summator s12, as shown in FIG. 7, is 4.225. The inputs to that summator are the output of amplifier g5 delayed by one clock cycle and the output of amplifier g6 without any delay. Looking at FIG. 6 for the output of the amplifier g6, we see 3.774. Since the output of amplifier g5 is delayed by one clock cycle, we have to look at FIG. 5 for the value that enters the summator. That value is 0.451. Thus, the output of the summator s12 is 3.774+0.451=4.225. Since the output of that summator then passes through one delay element z12001, the value at the output d15 is 0.5637 (i.e. the output of that summator at the prior clock cycle shown in FIG. 6).

The output of the summator s10, as shown in FIG. 7, is 1.622. The inputs to that summator are the output of the summator s9 and the output of amplifier g1 (without a delay). Looking at FIG. 6 for the output of the amplifier g1, we see 1.509; the output of summator s9, as shown in FIG. 6, is 0.1127. Thus, the output of the summator s10 is 1.622=1.509+0.113.

The output of summator s11, as shown in FIG. 7, is 7.018. The inputs to that summator are the output of the summator s10 and the output of amplifier g4. The output of summator s10 from the prior clock cycle shown in FIG. 6 is 0.2255. The output of amplifier g4 from the prior clock cycle shown in FIG. 6 is 6.793. 6.793+0.2255=7.018.

Finally, output o4 is simply the output of the amplifier g7 delayed by two clock cycles. The value of the amplifier g7 two clock cycles ago (looking at FIG. 5) was 0.7892. Thus, two clock cycles later, the output o4 is 0.7892.

Thus, the output vector shown at outputs o1-o4 is:

$$\begin{matrix} 2.264 \\ 7.018 \\ 0.5637 \\ 0.7892 \end{matrix}$$

The result of multiplying the matrix by the input vector is:

$$\begin{bmatrix} 2 & 0 & 0 & 3 \\ 3 & 1 & 2 & 9 \\ 0 & 4 & 5 & 0 \\ 0 & 0 & 7 & 0 \end{bmatrix} \times \begin{bmatrix} 0 \\ 0 \\ 0.1127 \\ 0.7547 \end{bmatrix} = \begin{bmatrix} 2.264 \\ 7.018 \\ 0.5637 \\ 0.7892 \end{bmatrix}$$

FIG. 7 also shows the new value added to the input vector, which is −0.2711. The input vector is now:

$$\begin{matrix} 0 \\ 0.1127 \\ 0.7547 \\ -0.2711 \end{matrix}$$

Figure 8:
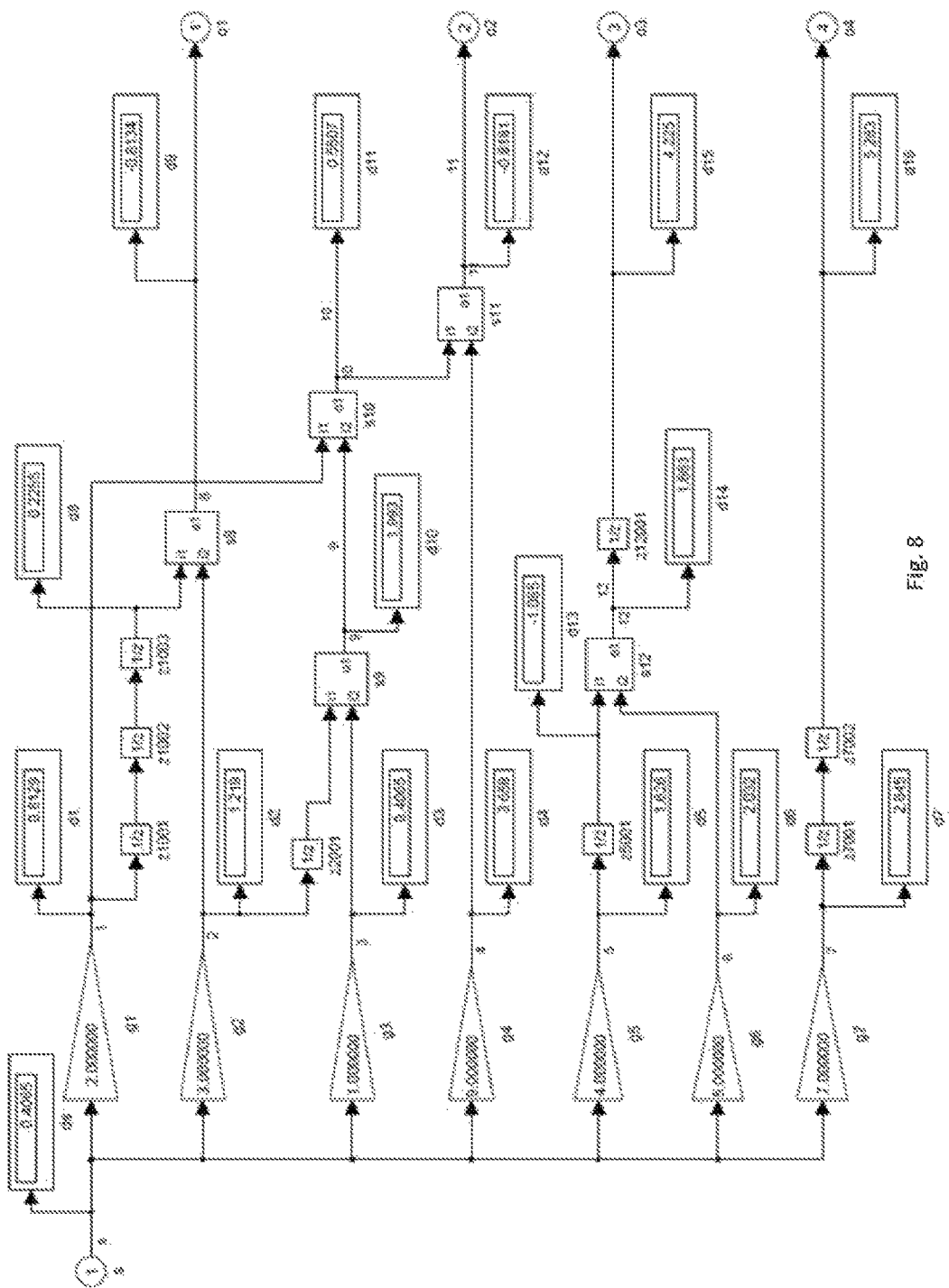
FIG. 8 shows a circuit of the present invention in operation.
Figure 9:
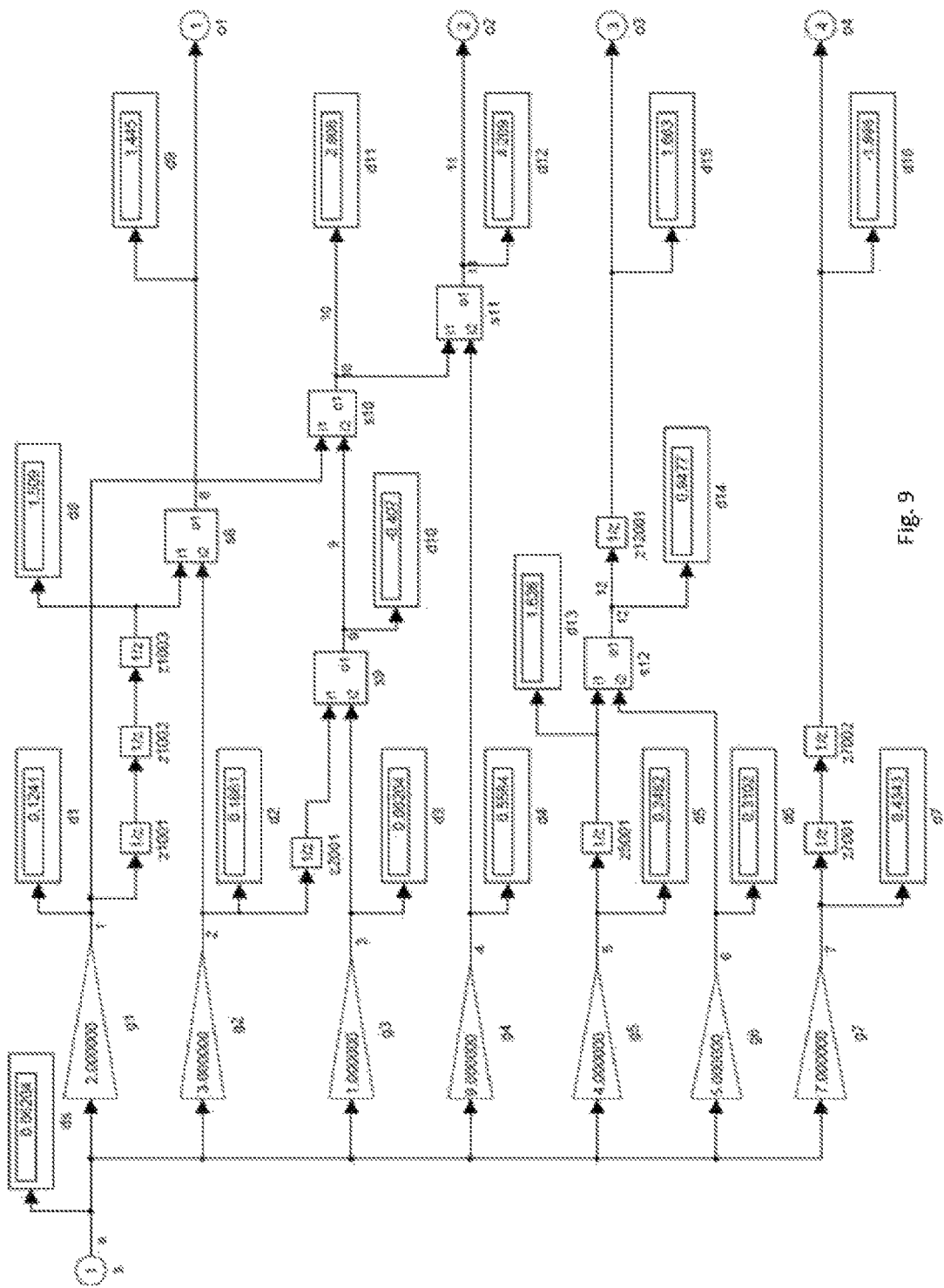
FIG. 9 shows a circuit of the present invention in operation.
Figure 10:
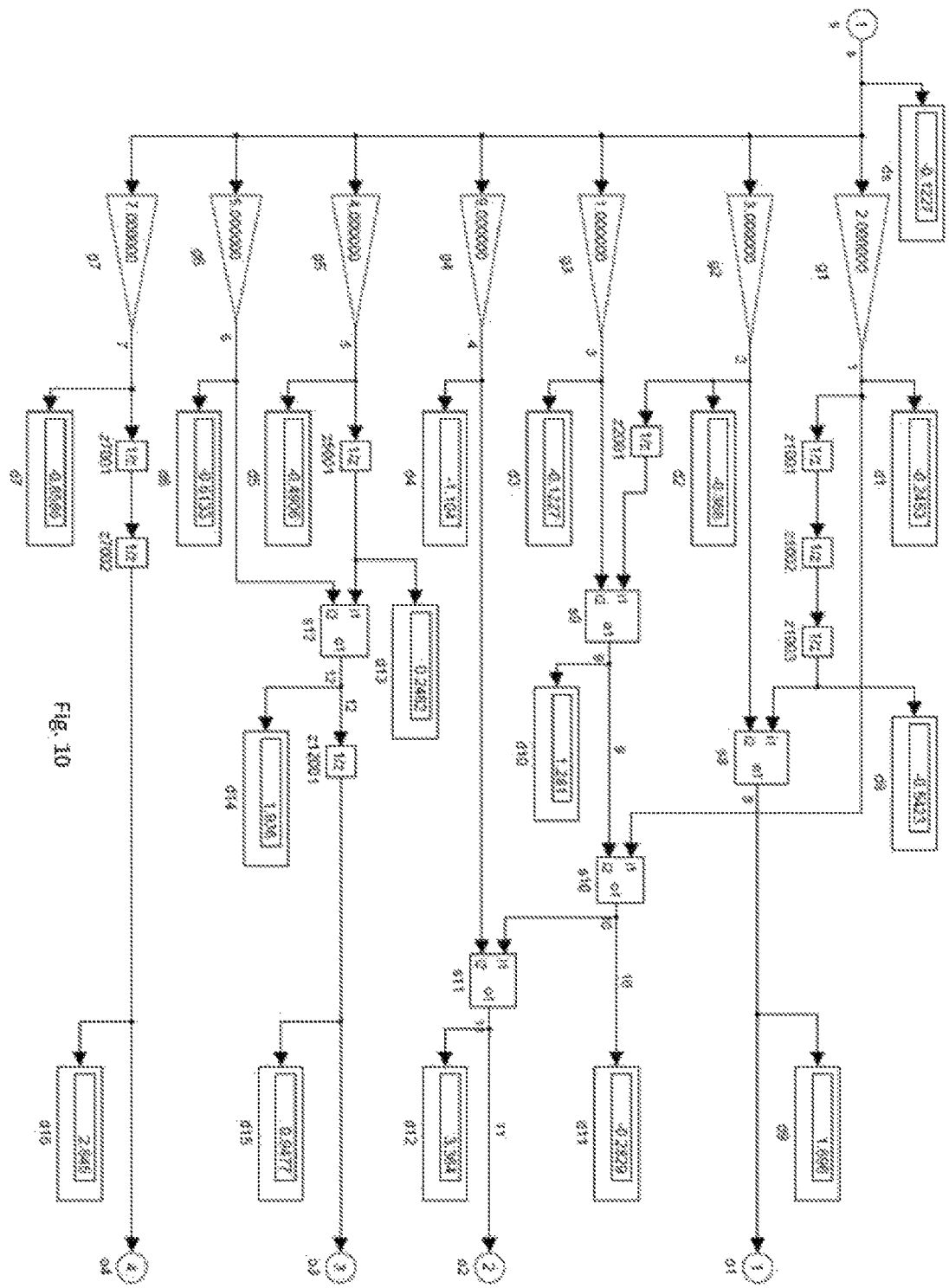
FIG. 10 shows a circuit of the present invention in operation.

FIGS. 8-10 show the next three clock cycles of the multiplication process. As shown in FIG. 8, the output vector is:

$$\begin{matrix} -0.8134 \\ -0.8181 \\ 4.225 \\ 5.283 \end{matrix}$$

The result of multiplying the matrix by the input vector is:

$$\begin{bmatrix} 2 & 0 & 0 & 3 \\ 3 & 1 & 2 & 9 \\ 0 & 4 & 5 & 0 \\ 0 & 0 & 7 & 0 \end{bmatrix} \times \begin{bmatrix} 0 \\ 0.1127 \\ 0.7547 \\ -0.2711 \end{bmatrix} = \begin{bmatrix} -0.8134 \\ -0.8181 \\ 4.225 \\ 5.283 \end{bmatrix}$$

FIG. 8 also shows the new input value added to the input vector, which is 0.4065. The input vector is now:

$$\begin{matrix} 0.1127 \\ 0.7547 \\ -0.2711 \\ 0.4065 \end{matrix}$$

The result of multiplying the matrix by this input vector is shown in FIG. 9 as the output vector:

$$\begin{matrix} 1.445 \\ 4.209 \\ 1.663 \\ -1.898 \end{matrix}$$

Here is the matrix multiplication that confirms this result:

$$\begin{bmatrix} 2 & 0 & 0 & 3 \\ 3 & 1 & 2 & 9 \\ 0 & 4 & 5 & 0 \\ 0 & 0 & 7 & 0 \end{bmatrix} \times \begin{bmatrix} 0.1127 \\ 0.7547 \\ -0.2711 \\ 0.4065 \end{bmatrix} = \begin{bmatrix} 1.445 \\ 4.209 \\ 1.663 \\ -1.898 \end{bmatrix}$$

FIG. 9 also shows the next input value, 0.06204. The input vector is now:

$$\begin{matrix} 0.7547 \\ -0.2711 \\ 0.4065 \\ 0.06204 \end{matrix}$$

The result of multiplying the matrix by this input vector is shown in FIG. 10 as the output vector:

$$\begin{matrix} 1.696 \\ 3.364 \\ 0.9477 \\ 2.845 \end{matrix}$$

Here is the matrix multiplication that confirms the result:

$$\begin{bmatrix} 2 & 0 & 0 & 3 \\ 3 & 1 & 2 & 9 \\ 0 & 4 & 5 & 0 \\ 0 & 0 & 7 & 0 \end{bmatrix} \times \begin{bmatrix} 0.7547 \\ -0.2711 \\ 0.4065 \\ 0.06204 \end{bmatrix} = \begin{bmatrix} 1.696 \\ 3.364 \\ 0.9477 \\ 2.845 \end{bmatrix}$$

As shown in FIGS. 5-10, each value is added to the input vector at the bottom, and the topmost value from the previous clock cycle is deleted, making it possible to perform matrix-vector multiplication in a conveyor-belt fashion.

It will be noted that the example described above is simply an example, and that the invention is in no way limited to any of the values or dimensions shown in the example. The example is used solely for illustration of the operation of the circuit of the present invention; the limitations of the present invention are set out in the appended Claims.

The invention claimed is:

1. A method of constructing a circuit for performing multiplication of an input vector by a first matrix, comprising:

determining a pipeline delay associated with an adder circuit;

determining a maximum delay, wherein the maximum delay is the sum of the pipeline delay and the number of columns in the first matrix, minus 1;

determining all the unique nonzero elements of the first matrix and putting them into a kernel vector, wherein each unique nonzero element of the first matrix is associated with an index;

replacing each nonzero element in the first matrix by the index of the element in the kernel vector to create a commutator matrix;

repeating the following steps until there is at most one nonzero element on each row of the commutator matrix, thus obtaining a processed commutator matrix:

repeating the following steps until all the pairs are identified:

identifying a pair, wherein a pair is a horizontal pattern comprising a first nonzero element and a second nonzero element in the same row as the first nonzero element;

determining the distance between the first nonzero element and the second nonzero element, wherein the distance is 1 when the first nonzero element and the second nonzero element are located directly next to each other and increases by 1 for every element located between the first nonzero element and the second nonzero element;

identifying all the pairs with the same first nonzero element, the same second nonzero element, and the same distance between the first nonzero element and the second nonzero element;

determining the frequency of occurrence of each pair;

determining if there is a pair with a highest frequency of occurrence;

if the pair with the highest frequency of occurrence exists, identifying that pair;

if there is no pair that has the highest frequency of occurrence, identifying a random pair;

creating a row in the pair matrix for the identified pair, wherein the row comprises an index, the first nonzero element, the second nonzero element, the distance, and an additional delay element, which is initially set to zero, wherein the lowest index is the number of elements in the kernel vector plus 1;

for every occurrence of the identified pair, replacing the first nonzero element by the index and the second nonzero element by a zero;

creating an output pair index vector, comprising the nonzero element of each row of the processed commutator matrix, wherein if a row of the processed commutator matrix does not comprise a nonzero element, the corresponding element of the output pair index vector is a zero;

creating an output delay vector, wherein each element of the output delay vector is the difference between the maximum delay and the number of zeros to the right of each nonzero element in the processed commutator matrix, wherein if a row of the processed commutator matrix does not comprise a nonzero element, the corresponding element of the output delay vector is a zero;

processing the pair matrix as follows:

for each row of the pair matrix, determining whether or not the first nonzero element is an element of the kernel vector;

if the first nonzero element is not an element of the kernel vector, subtracting the pipeline delay from the distance in that row;

for each row of the pair matrix, determining whether or not the second nonzero element is an element of the kernel vector;

if the second nonzero element is not an element of the kernel vector, subtracting the pipeline delay from the additional delay element in that row;

once all the rows are processed, determining the smallest negative number in the delays;

adding the absolute value of that number to each distance element and each additional delay element in each row of the pair matrix to obtain a processed pair matrix;

using the processed pair matrix to create a circuit as follows:

for each element of the kernel vector, routing an input signal through a plurality of amplifiers, wherein the number of amplifiers is the same as the number of elements in the kernel vector, wherein each amplifier amplifies the signal by the magnitude of the corresponding element in the kernel vector, to obtain a plurality of amplified output signals, wherein each amplified output signal is numbered according to the index of the element in the kernel vector;

for each row of the processed pair matrix, performing the following actions:

connecting the output signal whose index is the same as the second element of the row to a delay element, wherein the delay of the delay element is the fourth element of the same row of the processed pair matrix, to obtain a first delayed signal;

connecting the output signal whose index is the same as the third element of the row to a delay element, wherein the delay of the delay element is the fifth element of the same row of the processed pair matrix, to obtain a second delayed signal;

connecting the first delayed signal and the second delayed signal to an adder circuit to obtain an output signal;

numbering the output of the adder circuit with the index of the row of the processed pair matrix;

for each element of the output pair index vector, connecting an output with the index equal to the element of the output pair index vector to a delay element whose delay is equal to the corresponding element of the output delay vector, and connecting the output of the delay element to the output;

if an element of the output pair index vector is a zero, connecting the output to ground.

2. The method of claim 1, wherein the step of connecting an output to a delay element comprises:

creating a delay element by serially connecting a plurality of delay elements, each delay element possessing a delay of one unit, wherein the number of serially connected delay elements equals the maximum delay;

connecting the output of the delay element to a connection between a first and second delay element, wherein the first and second delay element are located in such a way as to result in a delay between the output and the output of the delay element that equals to the corresponding element of the output delay vector.

3. The method of claim 1, wherein the step of connecting an output to a delay element comprises:
- creating a delay element by serially connecting a plurality of delay elements, each delay element possessing a delay of one unit, wherein the number of serially connected delay elements equals the corresponding element of the output delay vector;
- connecting the output of the delay element to the last delay element in the plurality of serially connected delay elements.

* * * * *